(12) United States Patent
Park et al.

(10) Patent No.: US 8,294,168 B2
(45) Date of Patent: Oct. 23, 2012

(54) LIGHT SOURCE MODULE USING QUANTUM DOTS, BACKLIGHT UNIT EMPLOYING THE LIGHT SOURCE MODULE, DISPLAY APPARATUS, AND ILLUMINATION APPARATUS

(75) Inventors: Il-woo Park, Suwon-si (KR);
Chang-hoon Kwak, Seoul (KR);
Hyo-jin Lee, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 92 days.

(21) Appl. No.: 12/846,335

(22) Filed: Jul. 29, 2010

(65) Prior Publication Data

US 2011/0309325 A1  Dec. 22, 2011

Related U.S. Application Data

(60) Provisional application No. 61/351,625, filed on Jun. 4, 2010.

(30) Foreign Application Priority Data

Jul. 6, 2010 (KR) .................. 10-2010-0064878

(51) Int. Cl.
*H01L 33/00* (2010.01)

(52) U.S. Cl. .................. 257/98; 257/E33.056
(58) Field of Classification Search .............. 257/13, 257/9, 88, 89, 79, 98, E33.056; 313/505, 313/506, 512
See application file for complete search history.

(56) References Cited

U.S. PATENT DOCUMENTS

| | | | |
|---|---|---|---|
| 2007/0018558 A1* | 1/2007 | Chua et al. | 313/485 |
| 2008/0000122 A1* | 1/2008 | Shotton | 40/605 |
| 2009/0234343 A1* | 9/2009 | Behrakis | 606/9 |
| 2010/0051898 A1* | 3/2010 | Kim et al. | 257/9 |
| 2010/0123155 A1* | 5/2010 | Pickett et al. | 257/98 |

* cited by examiner

*Primary Examiner* — A. Sefer
*Assistant Examiner* — Nikolay Yushin
(74) *Attorney, Agent, or Firm* — McDermott Will & Emery LLP (57) ABSTRACT

A light source module using quantum dots, a backlight unit employing the light source module, a display apparatus, and an illumination apparatus. The light source module includes a light emitting device package including a plurality of light emitting device chips, and a quantum dot sealing package disposed on the light emitting device package in a light emitting direction, and converts wavelengths of light emitted from the light emitting device chips to generate wavelength-converted light.

30 Claims, 7 Drawing Sheets

LIGHT SOURCE MODULE USING QUANTUM DOTS, BACKLIGHT UNIT EMPLOYING THE LIGHT SOURCE MODULE, DISPLAY APPARATUS, AND ILLUMINATION APPARATUS

CROSS-REFERENCE TO RELATED PATENT APPLICATION

This application claims the benefit of U.S. Provisional Patent Application No. 61/351,625, filed on Jun. 4, 2010, in the U.S. Patent and Trademark Office, and the benefit of Korean Patent Application No. 10-2010-0064878, filed on Jul. 6, 2010, in the Korean Intellectual Property Office, the disclosures of which are incorporated herein in their entirety by reference.

BACKGROUND OF THE INVENTION

1. Field of the Invention

The present invention relates to a light source module using quantum dots, a backlight unit employing the light source module, a display apparatus, and an illumination apparatus.

2. Description of the Related Art

Quantum dots are nano crystals having diameters equal to or less than about 10 nm, are formed of a semiconductor material, and cause a quantum confinement effect. Quantum dots generate more intensive light in a narrower wavelength band in comparison to typical phosphor. Quantum dots emit light while excited electrons transit from a conduction band to a valence band, and have characteristics that a wavelength of light varies according to particle sizes even in the same material. Since the wavelength of light varies according to a size of the quantum dots, light having a desired wavelength region may be obtained by controlling the size of the quantum dots.

Quantum dots are naturally coordinated and dispersed in an organic solvent. If quantum dots are not appropriately dispersed or are exposed to oxygen or moisture, light emission efficiency is reduced. In order to solve this problem, a method of capping quantum dots with an organic material or a material having a large band gap has been developed. However, a problem of the above method has been pointed out with respect to utility in view of a process or a cost. Accordingly, a method of utilizing quantum dots more stably with a higher light emission performance is required. For example, a method of protecting quantum dots from oxygen or moisture by inserting an organic solvent or a polymer, in which the quantum dots are dispersed, into a polymer cell or a glass cell is suggested and attempted to be used in an illumination apparatus.

SUMMARY OF THE INVENTION

The present invention provides a light source module capable of using quantum dots in a stable form, a backlight unit employing the light source module, a display apparatus, and an illumination apparatus.

According to an aspect of the present invention, there is provided a light source module using quantum dots, the light source module including a light emitting device package comprising a substrate and a plurality of light emitting device chips mounted on the substrate; and a quantum dot sealing package disposed on the light emitting device package in a light emitting direction and comprising a sealing member and the quantum dots sealed by the sealing member.

The quantum dot sealing package may be directly bonded to the light emitting device package. Alternatively, the quantum dot sealing package may be separate from the light emitting device package. In this case, the light source module may further include a supporting member for supporting and separating the quantum dot sealing package from the light emitting device package.

The sealing member may be a flat-panel-type tube. Also, the sealing member may be a bar-type tube. The sealing member may be a glass tube or a polymer tube.

The plurality of light emitting device chips may be aligned in a row or a plurality of rows. Also, the plurality of light emitting device chips may be aligned in a straight line, a curved line, or a predetermined pattern. In this case, the sealing member may be formed in a straight line, a curved line, or a predetermined pattern corresponding to alignment of the plurality of light emitting device chips.

The quantum dots may be dispersed in an organic solvent or a polymer resin. In this case, the organic solvent may include at least one of toluene, chloroform, and ethanol. Also, the polymer resin may include at least one of epoxy, silicone, polysthylene, and acrylate.

The quantum dots may include one of silicon (Si)-based nano crystals, Group II-VI-based compound semiconductor nano crystals, Group III-V-based compound semiconductor nano crystals, Group IV-VI-based compound semiconductor nano crystals, and mixtures thereof. The Group II-VI-based compound semiconductor nano crystals may be formed of one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe. The Group III-V-based compound semiconductor nano crystals may be formed of one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The Group IV-VI-based compound semiconductor nano crystals may be formed of SbTe.

The quantum dots may include first quantum dots having a size for allowing a peak wavelength to be in a wavelength band of green light. Also, the quantum dots may include second quantum dots having a size for allowing a peak wavelength to be in a wavelength band of red light.

The plurality of light emitting device chips may be light emitting diode (LED) chips or organic light emitting diode (OLED) chips.

The light emitting device package may be a chip on board (COB) type package. For example, the substrate may be a printed circuit board (PCB), and the plurality of light emitting device chips may be directly mounted on the substrate. In this case, the light source module may further include transmissive resin encapsulation portions for coating the plurality of light emitting device chips and prepared on the substrate.

The substrate may be a PCB, every one or more of the plurality of light emitting device chips may be packaged into a chip package, and the chip packages may be mounted on the substrate.

The light emitting device package 410 may be a chip on lead-frame (COL)-type package. For example, the substrate may include a lead frame for circuit-connecting the plurality of light emitting device chips to each other, and a mold member for fixing the plurality of light emitting device chips and the lead frame.

The plurality of light emitting device chips may be blue LED chips, and the quantum dots may include first quantum dots having a size for allowing a peak wavelength to be in a wavelength band of green light; and second quantum dots having a size for allowing a peak wavelength to be in a wavelength band of red light.

Blue light emitted from the blue LED chips may have a wavelength of 435 to 470 nm, a color coordinate of green light emitted from the first quantum dots may be in a region surrounded by four vertices (0.1270, 0.8037), (0.4117, 0.5861), (0.4197, 0.5316), and (0.2555, 0.5030) in a Commission Internationale de l'Eclairage (CIE) 1931 color coordinate system, and a color coordinate of red light emitted from the second quantum dots may be in a region surrounded by four vertices (0.5448, 0.4544), (0.7200, 0.2800), (0.6427, 0.2905), and (0.4794, 0.4633) in a CIE 1931 color coordinate system.

Furthermore, a color coordinate of green light emitted from the first quantum dots may be in a region surrounded by four vertices (0.1270, 0.8037), (0.3700, 0.6180), (0.3700, 0.5800), and (0.2500, 0.5500) in a CIE 1931 color coordinate system, and a color coordinate of red light emitted from the second quantum dots may be in a region surrounded by four vertices (0.6000, 0.4000), (0.7200, 0.2800), (0.6427, 0.2905), and (0.6000, 0.4000) in a CIE 1931 color coordinate system.

The blue LED chips may have a full-width half-maximum (FWHM) of 10 to 30 nm, the first quantum dots may have an FWHM of 10 to 60 nm, and the second quantum dots may have an FWHM of 30 to 80 nm.

The plurality of light emitting device chips may be ultraviolet LED chips, and the quantum dots may include first quantum dots having a size for allowing a peak wavelength to be in a wavelength band of blue light; second quantum dots having a size for allowing a peak wavelength to be in a wavelength band of green light; and third quantum dots having a size for allowing a peak wavelength to be in a wavelength band of red light.

According to another aspect of the present invention, there is provided a backlight unit including a light source module using quantum dots, the light source module comprising a light emitting device package comprising a substrate and a plurality of light emitting device chips mounted on the substrate, and a quantum dot sealing package disposed on the light emitting device package in a light emitting direction and comprising a sealing member and the quantum dots sealed by the sealing member; and a light guide plate.

According to another aspect of the present invention, there is provided a display apparatus including a light source module using quantum dots, the light source module comprising a light emitting device package comprising a substrate and a plurality of light emitting device chips mounted on the substrate, and a quantum dot sealing package disposed on the light emitting device package in a light emitting direction and comprising a sealing member and the quantum dots sealed by the sealing member; a light guide plate; and an image panel for displaying an image.

According to another aspect of the present invention, there is provided an illumination apparatus including a light source module using quantum dots, the light source module comprising a light emitting device package comprising a substrate and a plurality of light emitting device chips mounted on the substrate, and a quantum dot sealing package disposed on the light emitting device package in a light emitting direction and comprising a sealing member and the quantum dots sealed by the sealing member; and a power supply unit for supplying power to the light source module.

A power source may be prepared outside the illumination apparatus, and the power supply unit may include an interface for receiving power; and a power control unit for controlling power to be supplied to the light source module. In some cases, the power source may be prepared in the illumination apparatus.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining embodiments of the invention with reference to the attached drawings. In the drawings, like reference numerals denote like elements and the sizes or thicknesses of elements may be exaggerated for clarity of explanation.

Figure 1:
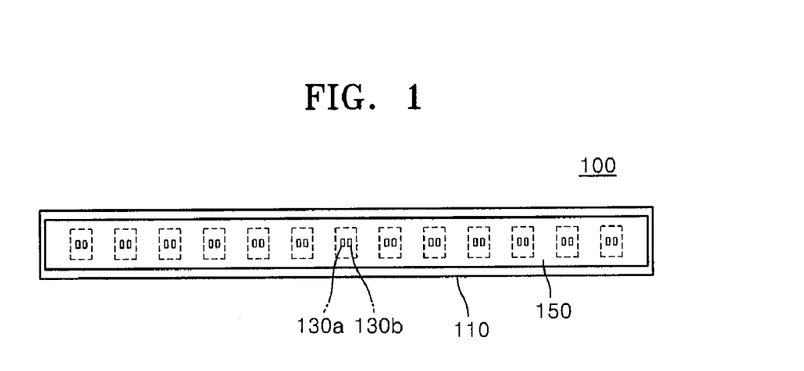
FIG. 1 is a plan view of a light source module using quantum dots, according to an embodiment of the present invention.
Figure 2:
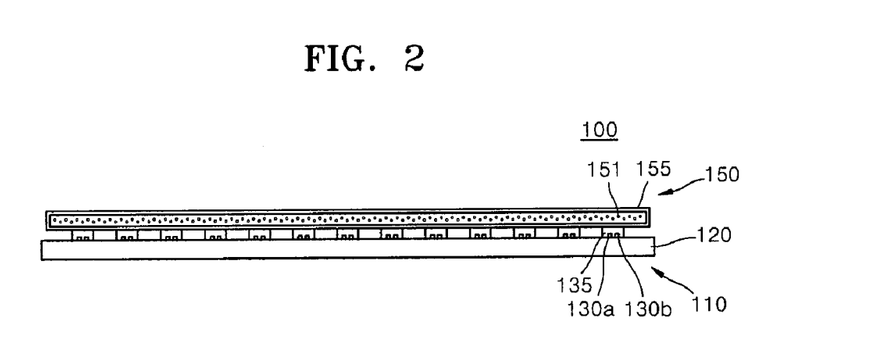
FIG. 2 is a side view of the light source module illustrated in FIG. 1.

FIG. 1 is a plan view of a light source module 100 using quantum dots 151, according to an embodiment of the present invention. FIG. 2 is a side view of the light source module 100 illustrated in FIG. 1.

Referring to FIGS. 1 and 2, the light source module 100 according to the current embodiment is a white light source and includes a light emitting device package 110 including a plurality of light emitting device chips 130a and 130b, and a quantum dot sealing package 150 disposed on the light emitting device package 110 in a light emitting direction.

In the light emitting device package 110, the light emitting device chips 130a and 130b are directly mounted on a circuit substrate 120 such as a printed circuit board (PCB). The light emitting device chips 130a and 130b may be GaN-based light emitting diode (LED) chips for emitting blue light. However, in some cases, the light emitting device chips 130a and 130b may be ultraviolet LED chips. Alternatively, the light emitting device chips 130a and 130b may be organic light emitting diode (OLED) chips or other well-known light emitting device chips. Zener diode chips may be also mounted to protect the light emitting device chips 130a and 130b. A plurality of the light emitting device chips 130a and 130b may be wired by using a flip chip bonding method or a wire bonding method. The light emitting device chips 130a and 130b may be coated and protected by transmissive resin encapsulation portions 135. Although the light emitting device chips 130a and 130b are coated by the transmissive resin encapsulation portions 135 in pairs of two in FIGS. 1 and 2, the current embodiment is not limited thereto. For example, one, three, or more of the light emitting device chips 130a and 130b may be coated by each of the transmissive resin encapsulation portions 135. Alternatively, the transmissive resin encapsulation portions 135 may be omitted. Also, the light emitting device chips 130a and 130b are aligned in a row in FIGS. 1 and 2, the current embodiment is not limited thereto. For example, the light emitting device chips 130a and 130b may be aligned in a plurality of rows, or may be aligned in a curved line or a predetermined pattern instead of a straight line. The light emitting device package 110 is an example of a chip on board (COB) type package.

The quantum dot sealing package 150 is bonded to and disposed on the light emitting device package 110 in the light emitting direction.

The quantum dot sealing package 150 includes a sealing member 155 and the quantum dots 151 injected into the sealing member 155. The sealing member 155 protects the quantum dots 151 from the external environment such as oxygen or moisture, and may be a glass tube or a polymer tube formed of a transparent material. The sealing member 155 may be a tube having a linear shape, i.e., a bar-type tube, corresponding to the alignment of the light emitting device chips 130a and 130b. If the light emitting device chips 130a and 130b are aligned in a curved line or a predetermined pattern, the sealing member 155 may be a curved or patterned tube correspondingly, or may be a flat-panel-type tube that covers the entire region where the light emitting device chips 130a and 130b are aligned.

The quantum dots 151 are nano crystals having diameters of about 1 to 10 nm, are formed of a semiconductor material, and cause a quantum confinement effect. The quantum dots 151 convert wavelengths of light emitted from the light emitting device chips 130a and 130b and generate wavelength-converted light, i.e., fluorescent light.

Examples of the quantum dots 151 include silicon (Si)-based nano crystals, Group II-VI-based compound semiconductor nano crystals, Group III-V-based compound semiconductor nano crystals, and Group IV-VI-based compound semiconductor nano crystals. According to the current embodiment, the quantum dots 151 may be one or a mixture of the above examples.

In this case, the Group II-VI-based compound semiconductor nano crystals may be formed of one selected from the group consisting of, for example, CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe. The Group III-V-based compound semiconductor nano crystals may be formed of one selected from the group consisting of, for example, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The Group IV-VI-based compound semiconductor nano crystals may be formed of, for example, SbTe.

The quantum dots 151 are naturally coordinated and dispersed in a dispersion medium such as an organic solvent or a polymer resin and are sealed by the sealing member 155. The dispersion medium may be any transparent medium that does not influence the wavelength conversion performance of the quantum dots 151, is not denaturalized by light, and does not reflect or absorb light. For example, the organic solvent may include at least one of toluene, chloroform, and ethanol, and the polymer resin may include at least one of epoxy, silicone, polysthylene, and acrylate. If the polymer resin is used as the dispersion medium, the polymer resin in which the quantum dots 151 are dispersed may be injected into the sealing member 155 and then may be cured.

The quantum dots 151 emit light while excited electrons transit from a conduction band to a valence band, and have characteristics that a wavelength of light varies according to particle sizes even in the same material. Since the wavelength of light varies according to a size of the quantum dots 151, light having a desired wavelength region may be obtained by controlling the size of the quantum dots 151. The size of the quantum dots 151 may be controlled by appropriately changing growing conditions of nano crystals.

As described above, each of the light emitting device chips 130a and 130b may be a blue LED chip. In this case, the blue LED chip may emit light having a dominant wavelength of 435 to 470 nm. Meanwhile, the quantum dots 151 may include first quantum dots having a size for allowing a peak wavelength to be in a wavelength band of green light, and second quantum dots having a size for allowing a peak wavelength to be in a wavelength band of red light. In this case, the sizes of the first and second quantum dots may be appropriately controlled such that the peak wavelength of the first quantum dots is 500 to 550 nm and the peak wavelength of the second quantum dots is 580 to 660 nm.

Meanwhile, the quantum dots 151 generate more intensive light in a narrower wavelength band in comparison to typical phosphor. As such, in the quantum dots 151, the first quantum dots may have a full-width half-maximum (FWHM) of 10 to 60 nm and the second quantum dots may have an FWHM of 30 to 80 nm. Meanwhile, blue LED chips having an FWHM of 10 to 30 nm are used as the light emitting device chips 130a and 130b.

When quantum dots for emitting light of different colors are mixed, if the ratio of colors of the quantum dots varies, a user may view light of different wavelengths. In order to prevent this problem, materials need to be mixed in accurate densities and at an accurate ratio. In mixing the quantum dots, the light emission efficiency of the quantum dots has to be considered in addition to the densities. In a typical white light source that uses an array of LED packages in which quantum dots are mixed with a molding resin, controlling of densities, uniformities, and a mixing ratio of the quantum dots is restrictive, the LED packages may have a deviation in color coordinates between them. However, in the light source module 100, as the quantum dot sealing package 150 is prepared commonly for the plurality of the light emitting device chips 130a and 130b of the light emitting device package 110, the entire light source module 100 may have uniform color coordinates. Also, in the light source module 100, as the quantum dot sealing package 150 that is prepared separately in addition to the light emitting device package 110 controls the wavelength and intensity of light emission, desired color coordinates may be easily obtained.

Figure 3:
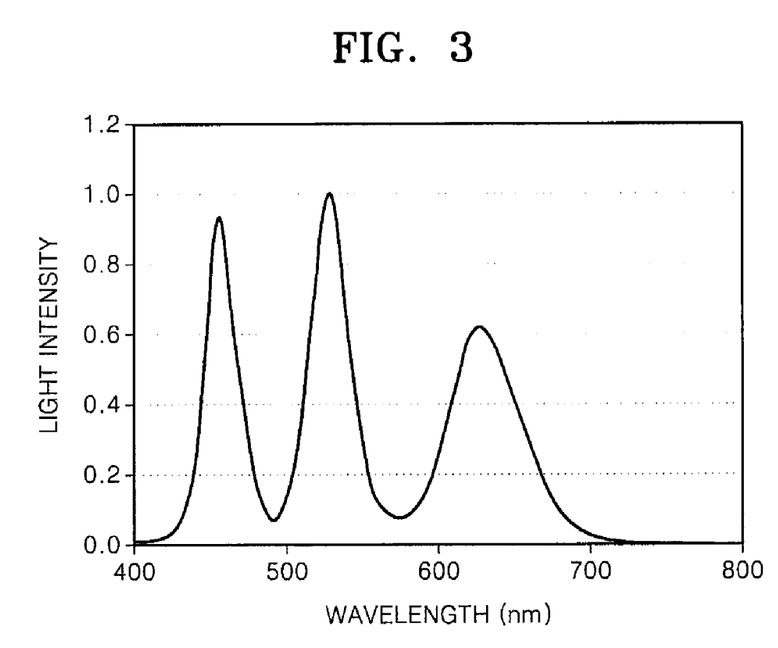
FIG. 3 is a graph showing light intensity in wavelength bands of light emitted from the light source module illustrated in FIG. 1.
Figure 4:
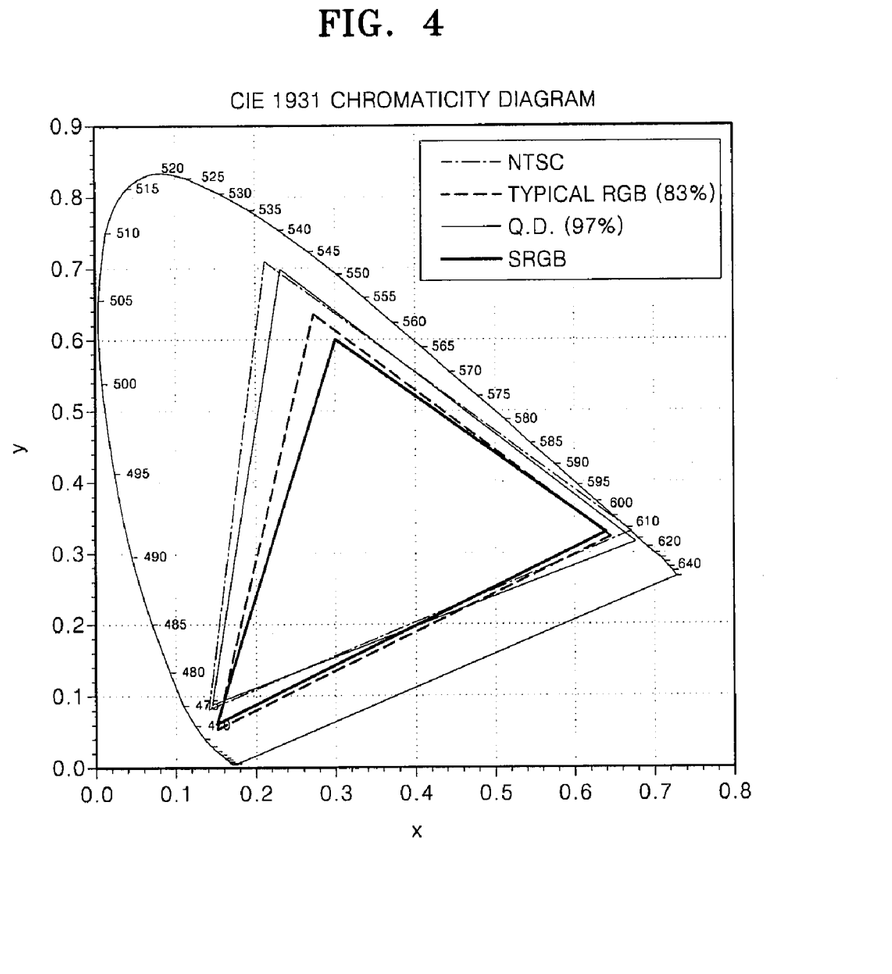
FIG. 4 is a graph showing a color coordinate region of light emitted from the light source module illustrated in FIG. 1.

FIG. 3 is a graph showing light intensity in wavelength bands of light emitted from the light source module 100 illustrated in FIG. 1. FIG. 4 is a graph showing a color coordinate region of light emitted from the light source module 100 illustrated in FIG. 1.

The light source module 100 may control wavelength bands by controlling particle sizes of the quantum dots 151 to obtain, for example, characteristics shown in Table 1.

TABLE 1

|  | Blue | Green | Red |
|---|---|---|---|
| Wp (nm) | 455 | 535 | 630 |
| FWHM (nm) | 20 | 30 | 54 |

In Table 1, Wp represents a dominant wavelength of each of blue light, green light, and red light, and FWHM represents a full-width half-maximum of each of blue light, green light, and red light. Referring to Table 1, blue light is emitted from the light emitting device chips 130a and 130b, green light and red light are emitted from the quantum dots 151, and blue light, green light, and red light have a distribution of light intensities as illustrated in FIG. 3.

Also, wavelength bands may be controlled by controlling particle sizes of the quantum dots 151, color coordinates may be controlled by controlling densities of the quantum dots 151 according to particle sizes. As such, as illustrated in FIG. 4, particles sizes and densities of the quantum dots 151 may be controlled such that a color coordinate of green light of the first quantum dots is in a region A surrounded by four vertices (0.1270, 0.8037), (0.4117, 0.5861), (0.4197, 0.5316), and (0.2555, 0.5030) in a Commission Internationale de l'Eclairage (CIE) 1931 color coordinate system, and a color coordinate of red light of the second quantum dots is in a region B surrounded by four vertices (0.5448, 0.4544), (0.7200, 0.2800), (0.6427, 0.2905), and (0.4794, 0.4633) in a CIE 1931 color coordinate system. As illustrated in FIG. 4, the light source module 100 having the above distribution of light covers a wider region in a CIE 1931 color coordinate system in comparison to a typical product using phosphor, has a color reproduction equal to or greater than 95% with respect to the National Television System Committee (NTSC), and has very high intensity of light emission.

Furthermore, since the quantum dots 151 generate more intensive light in a narrower wavelength band in comparison to typical phosphor as described above, the first and second quantum dots may be in narrower regions of color coordinates. That is, a color reproduction may be further increased by allowing a color coordinate of green light of the first quantum dots to be in a region A' surrounded by four vertices (0.1270, 0.8037), (0.3700, 0.6180), (0.3700, 0.5800), and (0.2500, 0.5500) in a CIE 1931 color coordinate system, and a color coordinate of red light of the second quantum dots to be in a region B' surrounded by four vertices (0.6000, 0.4000), (0.7200, 0.2800), (0.6427, 0.2905), and (0.6000, 0.4000) in a CIE 1931 color coordinate system.

As described above, the light source module 100 may realize a maximum color reproduction from combinations of the light emitting device chips 130a and 130b and the first and second quantum dots by defining a dominant wavelength of the light emitting device chips 130a and 130b and color coordinates of the first and second quantum dots in a CIE 1931 color coordinate system, into certain ranges or regions.

In the light source module 100, the light emitting device chips 130a and 130b are blue LED chips and the quantum dots 151 wavelength-convert blue light into red light and green light. However, the present invention is not limited thereto. For example, the light emitting device chips 130a and 130b may be ultraviolet LED chips and particle size and densities of the quantum dots 151 may be controlled to include first quantum dots having a size for allowing a peak wavelength to be in a wavelength band of blue light, second quantum dots having a size for allowing a peak wavelength to be in a wavelength band of green light, and third quantum dots having a size for allowing a peak wavelength to be in a wavelength band of red light. In this case, the light emitting device chips 130a and 130b, i.e., the ultraviolet LED chips, function as only an excitation light source of the quantum dot sealing package 150 for emitting white light.

Figure 5:
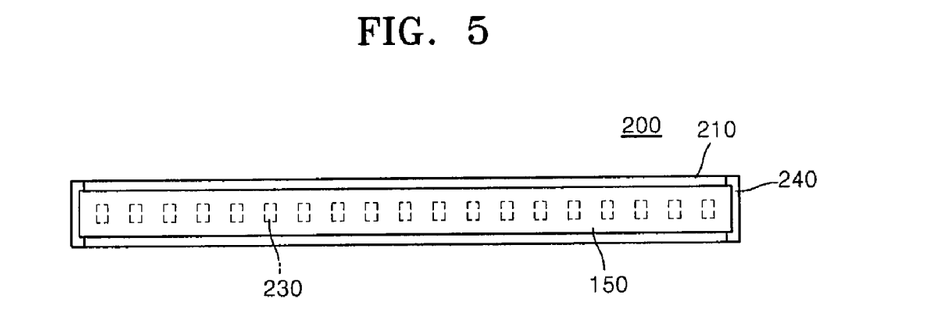
FIG. 5 is a plan view of a light source module using quantum dots, according to another embodiment of the present invention.
Figure 6:
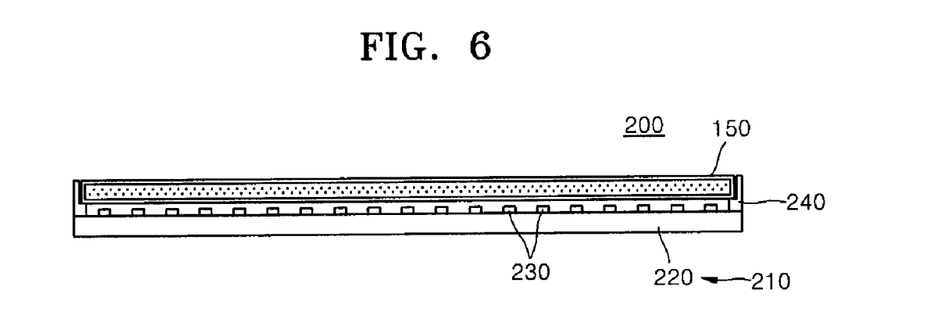
FIG. 6 is a side view of the light source module illustrated in FIG. 5.

FIG. 5 is a plan view of a light source module 200 using quantum dots, according to another embodiment of the present invention. FIG. 6 is a side view of the light source module 200 illustrated in FIG. 5.

Referring to FIGS. 5 and 6, the light source module 200 according to the current embodiment includes a light emitting device package 210 including a plurality of light emitting device chips 230, and a quantum dot sealing package 150 disposed on the light emitting device package 210 in a light emitting direction. The quantum dot sealing package 150 may be the same as that according to the previous embodiment.

The light source module 200 is different from the light source module 100 according to the previous embodiment in that the quantum dot sealing package 150 and the light emitting device package 210 are apart. That is, in the light source module 100, the quantum dot sealing package 150 is directly bonded to the light emitting device package 110. However, in the light source module 200, the quantum dot sealing package 150 is supported by an additional supporting member 240 and is separate from the light emitting device package 210. The quantum dot sealing package 150 may also be detachably supported the supporting member 240. In this case, light source characteristics of the light source module 200 may be easily changed by replacing the quantum dot sealing package 150 having different characteristics of color coordinates.

Meanwhile, the light emitting device package 210 is a COB-type package in which the light emitting device chips 230 are aligned and directly mounted on a circuit substrate 220 in a row, but is not limited thereto.

Figure 7:
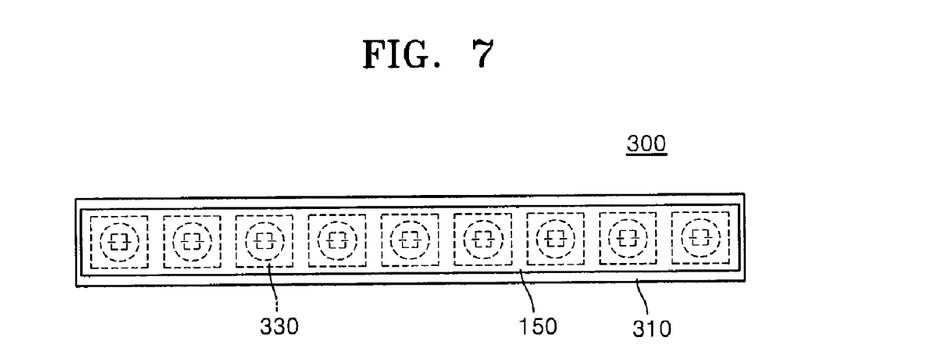
FIG. 7 is a plan view of a light source module using quantum dots, according to another embodiment of the present invention.
Figure 8:
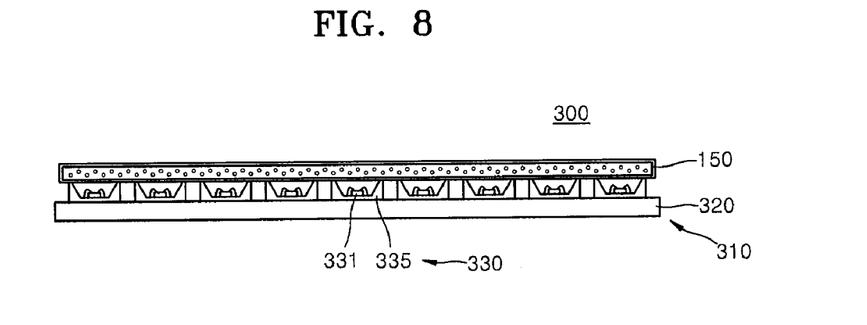
FIG. 8 is a side view of the light source module illustrated in FIG. 7.

FIG. 7 is a plan view of a light source module 300 using quantum dots, according to another embodiment of the present invention. FIG. 8 is a side view of the light source module 300 illustrated in FIG. 7.

Referring to FIGS. 7 and 8, the light source module 300 according to the current embodiment includes a light emitting device package 310 including a plurality of light emitting device chips 331, and a quantum dot sealing package 150 disposed on the light emitting device package 310 in a light emitting direction. The quantum dot sealing package 150 may be the same as those according to the previous embodiments.

The light source module 300 is different from the light source modules 100 and 200 according to the previous embodiments in that light emitting device chip packages 330 are bonded to a circuit substrate 320 such as a PCB in the light emitting device package 310. That is, in the light source module 100, the light emitting device chips 130a and 130b are directly mounted on the circuit substrate 120. However, in the light source module 300, the light emitting device chips 331 are separately packaged into the light emitting device chip packages 330 by additionally using mold members 335, and then the light emitting device chip packages 330 are mounted on the circuit substrate 320. In the light emitting device chip packages 330, grooves of the mold members 335, in which the light emitting device chips 331 are mounted, may form reflection cavities to improve the directivity of light emitted from the light emitting device chips 331.

Although one light emitting device chip 331 is mounted in each of the light emitting device chip packages 330 in FIGS. 7 and 8, two or more light emitting device chips 331 may be mounted or Zener diode chips may also be mounted to protect the light emitting device chips 331. Also, although the quantum dot sealing package 150 is bonded to the light emitting device package 310 in FIGS. 7 and 8, the quantum dot sealing package 150 may be supported by the additional supporting member 240 illustrated in FIG. 6 and may be separate from the light emitting device package 310.

Figure 9:
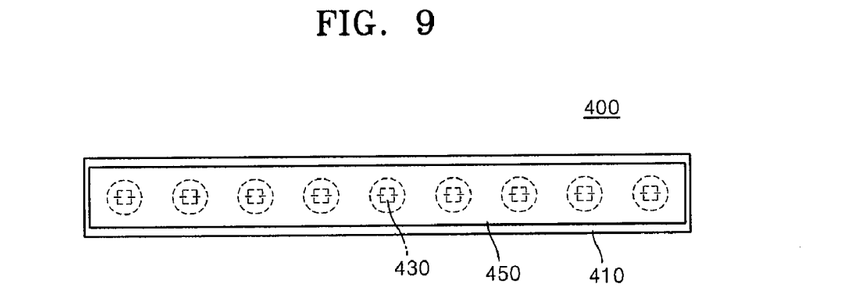
FIG. 9 is a plan view of a light source module using quantum dots, according to another embodiment of the present invention.
Figure 10:
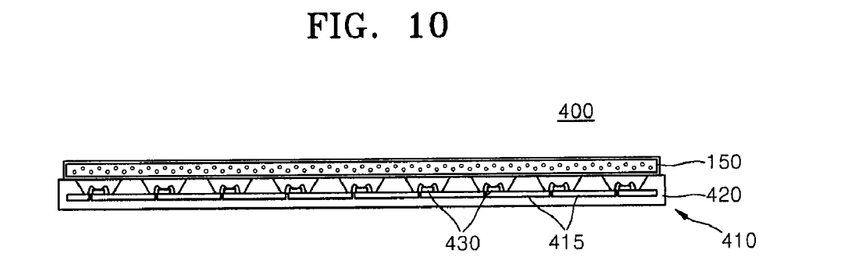
FIG. 10 is a side view of the light source module illustrated in FIG. 9.

FIG. 9 is a plan view of a light source module 400 using quantum dots, according to another embodiment of the present invention. FIG. 10 is a side view of the light source module 400 illustrated in FIG. 9.

Referring to FIGS. 9 and 10, the light source module 400 according to the current embodiment includes a light emitting device package 410 including a plurality of light emitting device chips 430, and a quantum dot sealing package 150 disposed on the light emitting device package 410 in a light emitting direction. The quantum dot sealing package 150 may be the same as those according to the previous embodiments.

The light source module 400 is different from the light source modules 100, 200, and 300 according to the previous embodiments in that the light emitting device package 410 is a chip on lead-frame (COL)-type package. That is, although the light emitting device packages 110, 210, and 310 according to the previous embodiments are a COB-type package or a package in which chip packages are mounted on a circuit substrate, the light emitting device package 410 is a COL-type package in which the light emitting device chips 430 are circuit-connected by a lead frame 415, and the light emitting device chips 430 and the lead frame 415 are packaged by using a mold member 420. In the light emitting device package 410, grooves of the mold member 420, in which the light emitting device chips 430 are mounted, may form reflection cavities to improve the directivity of light emitted from the light emitting device chips 430.

Although one light emitting device chip 430 is mounted in each of the grooves of the mold member 420 in FIGS. 9 and 10, two or more light emitting device chips 430 may be mounted or Zener diode chips may also be mounted to protect the light emitting device chips 430. Also, although the quantum dot sealing package 150 is bonded to the light emitting device package 410 in FIGS. 9 and 10, the quantum dot sealing package 150 may be supported by the additional supporting member 240 illustrated in FIG. 6 and may be separate from the light emitting device package 410.

Figure 11:
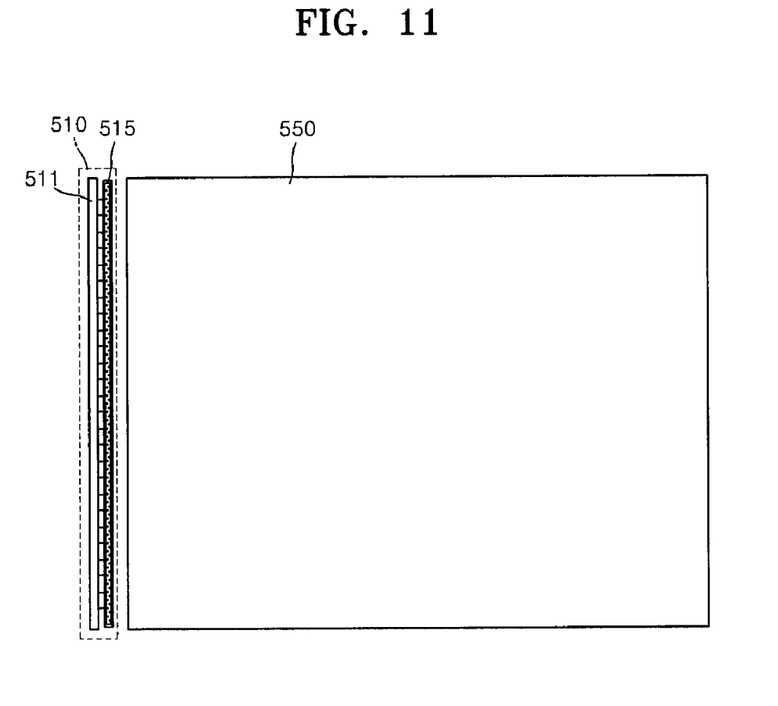
FIG. 11 is a schematic view of a backlight unit according to an embodiment of the present invention.

FIG. 11 is a schematic view of a backlight unit according to an embodiment of the present invention.

Referring to FIG. 11, the backlight unit according to the current embodiment is an edge-type backlight unit and includes a light guide plate 550 and a light source module 510 disposed at a side of the light guide plate 550. In the light source module 510, a quantum dot sealing package 515 is disposed on a light emitting device package 511 in a light emitting direction. The light source module 510 may be any of the light source modules 100, 200, 300, and 400 according to the previous embodiments.

The light guide plate 550 is a transparent and flat-panel-type member for guiding light. A predetermined pattern for emitting light outside may be formed on one of two surfaces of the light guide plate 550. The light source module 510 is disposed at a side of the light guide plate 550. Since light emitting device chips in the light emitting device package 511 of the light source module 510 may be aligned in a row and the quantum dot sealing package 515 may be a bar-type tube as described above in relation to FIGS. 1 and 2, a light emitting surface of the quantum dot sealing package 515 may face the side of the light guide plate 550. Light emitted from the light source module 510 passes through the side of the light guide plate 550 into the light guide plate 550, and is totally reflected to spread everywhere in the light guide plate 550. The light that is totally reflected in the light guide plate 550 is emitted outside through the surface of the light guide plate 550, on which the predetermined pattern is formed, i.e., a light emitting surface.

Figure 12:
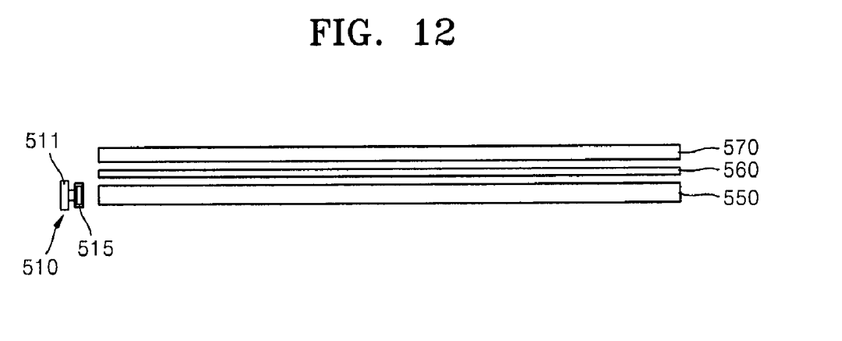
FIG. 12 is a schematic view of a display apparatus according to an embodiment of the present invention.

FIG. 12 is a schematic view of a display apparatus according to an embodiment of the present invention.

Referring to FIG. 12, the display apparatus according to the current embodiment uses the backlight unit illustrated in FIG. 11 and includes the light source module 510, the light guide plate 550, an optical film 560, and an image panel 570. The optical film 560 improves the directivity of light illuminated toward the image panel 570 and is disposed at a side of a light emitting surface of the light guide plate 550. The optical film 560 may include, for example, a prism sheet or a diffusion sheet. The image panel 570 is a device for converting an electrical image signal into an image, e.g., a liquid crystal display (LCD) panel. Light emitted from the light source module 510 passes through a side of the light guide plate 550 and is emitted through a light emitting surface of the light guide plate 550 as described above in relation to FIG. 11, and then passes through the optical film 560 to illuminate a rear surface of the image panel 570.

As described above, by using a quantum dot sealing package, the light source module 510 may realize white light of which a color reproduction is greatly improved, may allow all light emitting device chips to have uniform color coordinates, and thus may greatly improve color quality of the display apparatus. Furthermore, since quantum dots in the quantum dot sealing package are separated from the external environment by a sealing member, the quantum dots may be stably maintained and thus reliability may be greatly improved.

Figure 13:
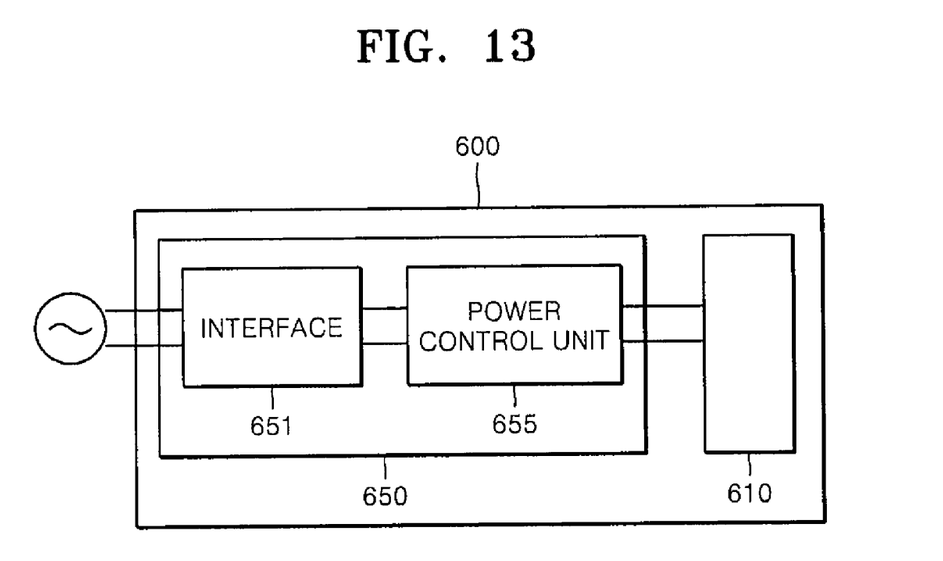
FIG. 13 is a structural view of an illumination apparatus according to an embodiment of the present invention.

FIG. 13 is a structural view of an illumination apparatus 600 according to an embodiment of the present invention. Referring to FIG. 13, the illumination apparatus 600 according to the current embodiment includes a light source module 610 and a power supply unit 650 for supplying power to the light source module 610.

The light source module 610 may be any of the light source modules 100, 200, 300, and 400 according to the previous embodiments. The power supply unit 650 may include a interface 651 for receiving power, and a power control unit 655 for controlling power to be supplied to the light source module 610. The interface 651 may include a fuse for blocking an over-current, and an electromagnetic shielding filter for shielding an electromagnetic interference signal. Power may be supplied from outside the illumination apparatus 600 or from a battery included in the illumination apparatus 600. If alternating current (AC) power is supplied, the power control unit 655 may include a rectification unit for converting an AC into a direct current (DC), and a constant voltage control unit for converting a DC voltage into a voltage that is appropriate for the light source module 610. If a power source is a DC source having a voltage that is appropriate for the light source module 610 (e.g., a battery), the rectification unit and the constant voltage control unit may be omitted. Also, if devices such as AC-LEDs are used as light emitting device chips of the light source module 610, AC power may be directly supplied to the light source module 610 and, in this case, the rectification unit and the constant voltage control unit may also be omitted. Furthermore, the power control unit 655 may control, for example, color temperature to realize illumination according to human sensitivity.

The illumination apparatus 600 may be applied to various devices using a light source. For example, as described above in relation to FIGS. 1 and 2, the alignment of light emitting device chips and the shape of a quantum dot sealing package in the light source module 610 may be designed in a straight line, a curved line, or a predetermined pattern. The illumination apparatus 600 may be a general illumination device for replacing a typical incandescent lamp or a fluorescent lamp and, in this case, a light emission spectrum of wavelength bands in a wide region may be obtained by controlling particle sizes of quantum dots used in a quantum dot sealing package of the light source module 610.

According to the above embodiments of the present invention, the following effects may be achieved.

First, as an organic solvent or a polymer in which quantum dots are dispersed is sealed in an additional sealing member, the influence of oxygen or moisture may be prevented and a light source module may stably operate in a hot and humid, or hot atmosphere.

Second, as a quantum dot sealing package is commonly prepared for a plurality of light emitting device chips, a process may be simplified, the productivity may be increased, and a manufacturing cost may be reduced.

Third, as a quantum dot sealing package is commonly prepared for a plurality of light emitting device chips, a deviation in color distribution of wavelength-converted light, which is caused when quantum dot phosphor is individually prepared for each light emitting device chip, may be suppressed, entire light emitting device chips may have uniform color coordinates, and a color reproduction may be greatly improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A light source module using quantum dots, the light source module comprising:
    a light emitting device package comprising a substrate and a plurality of light emitting device chips mounted on the substrate;
    a quantum dot sealing package disposed on the light emitting device package in a light emitting direction and comprising a sealing member and the quantum dots sealed by the sealing member; and
    a supporting member for supporting and separating the quantum dot sealing package from the light emitting device package,
    wherein the quantum dot sealing package is separate from the light emitting device package.

2. The light source module of claim 1, wherein the sealing member is a bar-type tube.

3. The light source module of claim 1, wherein the sealing member is a flat-panel-type tube.

4. The light source module of claim 1, wherein the sealing member is a glass tube or a polymer tube.

5. The light source module of claim 1, wherein the plurality of light emitting device chips are aligned in a row or a plurality of rows.

6. The light source module of claim 1, wherein the quantum dots comprise first quantum dots having a size for allowing a peak wavelength to be in a wavelength band of green light.

7. The light source module of claim 1, wherein the quantum dots comprise second quantum dots having a size for allowing a peak wavelength to be in a wavelength band of red light.

8. The light source module of claim 1, wherein the plurality of light emitting device chips are light emitting diode (LED) chips.

9. The light source module of claim 1, wherein the substrate is a PCB,
    wherein every one or more of the plurality of light emitting device chips are packaged into a chip package, and
    wherein the chip packages are mounted on the substrate.

10. The light source module of claim 1, wherein the substrate comprises:
    a lead frame for circuit-connecting the plurality of light emitting device chips to each other, and
    a mold member for fixing the plurality of light emitting device chips and the lead frame.

11. The light source module of claim 1, wherein the plurality of light emitting device chips are ultraviolet LED chips, and
    wherein the quantum dots comprise:
    first quantum dots having a size for allowing a peak wavelength to be in a wavelength band of blue light;
    second quantum dots having a size for allowing a peak wavelength to be in a wavelength band of green light; and
    third quantum dots having a size for allowing a peak wavelength to be in a wavelength band of red light.

12. The light source module of claim 1, wherein the plurality of light emitting device chips are aligned in a straight line, a curved line, or a predetermined pattern.

13. The light source module of claim 12, wherein the sealing member is formed in a straight line, a curved line, or a predetermined pattern corresponding to alignment of the plurality of light emitting device chips.

14. The light source module of claim 1, wherein the substrate is a printed circuit board (PCB), and
    wherein the plurality of light emitting device chips are directly mounted on the substrate.

15. The light source module of claim 14, further comprising transmissive resin encapsulation portions for coating the plurality of light emitting device chips and prepared on the substrate.

16. The light source module of claim 1, wherein the quantum dots are dispersed in an organic solvent or a polymer resin.

17. The light source module of claim 16, wherein the organic solvent comprises at least one of toluene, chloroform, and ethanol.

18. The light source module of claim 16, wherein the polymer resin comprises at least one of epoxy, silicone, polysthylene, and acrylate.

19. The light source module of claim 1, wherein the quantum dots comprise one of silicon (Si)-based nano crystals, Group II-VI-based compound semiconductor nano crystals, Group III-V-based compound semiconductor nano crystals, Group IV-VI-based compound semiconductor nano crystals, and mixtures thereof.

20. The light source module of claim 19, wherein the Group II-VI-based compound semiconductor nano crystals are formed of one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe, and HgZnSTe.

21. The light source module of claim 19, wherein the Group III-V-based compound semiconductor nano crystals are formed of one selected from the group consisting of GaN, GaP, GaAs, AlN, AlP, AlAs, InN, InP, InAs, GaNP, GaNAs, GaPAs, ALNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs.

22. The light source module of claim 19, wherein the Group IV-VI-based compound semiconductor nano crystals are formed of SbTe.

23. The light source module of claim 1, wherein the plurality of light emitting device chips are blue LED chips, and wherein the quantum dots comprise:
first quantum dots having a size for allowing a peak wavelength to be in a wavelength band of green light; and
second quantum dots having a size for allowing a peak wavelength to be in a wavelength band of red light.

24. The light source module of claim 23, wherein the blue LED chips have a full-width half-maximum (FWHM) of 10 to 30 nm,
wherein the first quantum dots have an FWHM of 10 to 60 nm, and
wherein the second quantum dots have an FWHM of 30 to 80 nm.

25. The light source module of claim 23, wherein blue light emitted from the blue LED chips has a wavelength of 435 to 470 nm,
wherein a color coordinate of green light emitted from the first quantum dots is in a region surrounded by four vertices (0.1270, 0.8037), (0.4117, 0.5861), (0.4197, 0.5316), and (0.2555, 0.5030) in a Commission Internationale de l'Eclairage (CIE) 1931 color coordinate system, and
wherein a color coordinate of red light emitted from the second quantum dots is in a region surrounded by four vertices (0.5448, 0.4544), (0.7200, 0.2800), (0.6427, 0.2905), and (0.4794, 0.4633) in a CIE 1931 color coordinate system.

26. The light source module of claim 25, wherein a color coordinate of green light emitted from the first quantum dots is in a region surrounded by four vertices (0.1270, 0.8037), (0.3700, 0.6180), (0.3700, 0.5800), and (0.2500, 0.5500) in a CIE 1931 color coordinate system, and
wherein a color coordinate of red light emitted from the second quantum dots is in a region surrounded by four vertices (0.6000, 0.4000), (0.7200, 0.2800), (0.6427, 0.2905), and (0.6000, 0.4000) in a CIE 1931 color coordinate system.

27. A backlight unit comprising:
a light source module using quantum dots, the light source module comprising a light emitting device package comprising a substrate and a plurality of light emitting device chips mounted on the substrate, and a quantum dot sealing package disposed on the light emitting device package in a light emitting direction and comprising a sealing member and the quantum dots sealed by the sealing member;
a light guide plate; and
a supporting member for supporting and separating the quantum dot sealing package from the light emitting device package,
wherein the quantum dot sealing package is separate from the light emitting device package.

28. A display apparatus comprising:
a light source module using quantum dots, the light source module comprising a light emitting device package comprising a substrate and a plurality of light emitting device chips mounted on the substrate, and a quantum dot sealing package disposed on the light emitting device package in a light emitting direction and comprising a sealing member and the quantum dots sealed by the sealing member;
a light guide plate;
an image panel for displaying an image; and
a supporting member for supporting and separating the quantum dot sealing package from the light emitting device package,
wherein the quantum dot sealing package is separate from the light emitting device package.

29. An illumination apparatus comprising:
a light source module using quantum dots, the light source module comprising a light emitting device package comprising a substrate and a plurality of light emitting device chips mounted on the substrate, a quantum dot sealing package disposed on the light emitting device package in a light emitting direction and comprising a sealing member and the quantum dots sealed by the sealing member, and a supporting member for supporting and separating the quantum dot sealing package from the light emitting device package; and
a power supply unit for supplying power to the light source module,
wherein the quantum dot sealing package is separate from the light emitting device package.

30. The illumination apparatus of claim 29, wherein the power supply unit comprises:
an interface for receiving power; and
a power control unit for controlling power to be supplied to the light source module.

* * * * *